US006328575B1

(12) United States Patent
Burrell

(10) Patent No.: US 6,328,575 B1
(45) Date of Patent: Dec. 11, 2001

(54) METHOD AND DEVICE FOR CONNECTING AN EL LAMP TO A PRINTED CIRCUIT BOARD

(75) Inventor: Jonathan C. Burrell, Olathe, KS (US)

(73) Assignee: Garmin Corporation (TW)

( * ) Notice: Subject to any disclaimer, the term of this patent is extended or adjusted under 35 U.S.C. 154(b) by 0 days.

(21) Appl. No.: 09/603,456

(22) Filed: Jun. 23, 2000

(51) Int. Cl.$^7$ .................................................. H01R 12/00
(52) U.S. Cl. ................................................ 439/74; 362/84
(58) Field of Search ............................. 439/69, 74, 862, 439/71, 66, 78, 79; 313/506, 483, 498, 502; 362/84, 396

(56) References Cited

U.S. PATENT DOCUMENTS

| | | | |
|---|---|---|---|
| 3,558,994 | * | 1/1971 | Bernstein ............................. 361/812 |
| 4,362,353 | * | 12/1982 | Cobaugh et al. ..................... 439/825 |
| 4,647,126 | * | 3/1987 | Sobata, Jr. ............................. 439/74 |
| 4,738,625 | * | 4/1988 | Burton et al. .......................... 439/59 |
| 5,661,364 | * | 8/1997 | Kruskopf ............................... 313/512 |
| 5,759,049 | * | 6/1998 | Gerber ................................... 439/74 |
| 5,868,582 | * | 2/1999 | Jacobi .................................... 439/74 |
| 5,888,076 | * | 3/1999 | Itoh et al. .............................. 439/74 |
| 5,889,364 | | 3/1999 | McGuigan et al. .................. 313/506 |
| 6,077,095 | * | 6/2000 | DelPrete et al. ....................... 439/92 |

* cited by examiner

*Primary Examiner*—Brian Sircus
*Assistant Examiner*—Son V. Nguyen
(74) *Attorney, Agent, or Firm*—Devon A. Rolf

(57) ABSTRACT

A method and connector for connecting an electroluminescent (EL) lamp to a printed circuit board utilizing a pair of unique connector clips. Each connector clip is formed of bent sheet metal and has a bottom, a top, a closed bent end and an open end. Each connector clip is attached to a printed circuit board and the periphery of an EL lamp is positioned in the clips by sliding the EL lamp into the mouth of the connector clips. In particular, the EL lamp has a pair of contact pads on a bottom surface thereof, such that each pad contacts the bottom of a corresponding one of the connector clips. In a method of attaching the EL lamp to the printed circuit board, the EL lamp is releasably positioned in the clips by sliding the lamp into the clips. In one embodiment, positioning the EL lamp into the clips is done manually. In another embodiment, positioning the EL lamp into the clips is accomplished by a surface mount device and, particularly, by a vacuum-holding device.

8 Claims, 5 Drawing Sheets

FIG. 11.
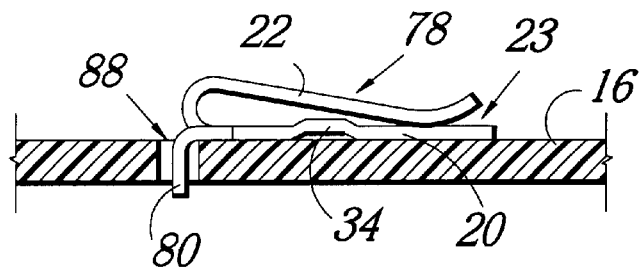
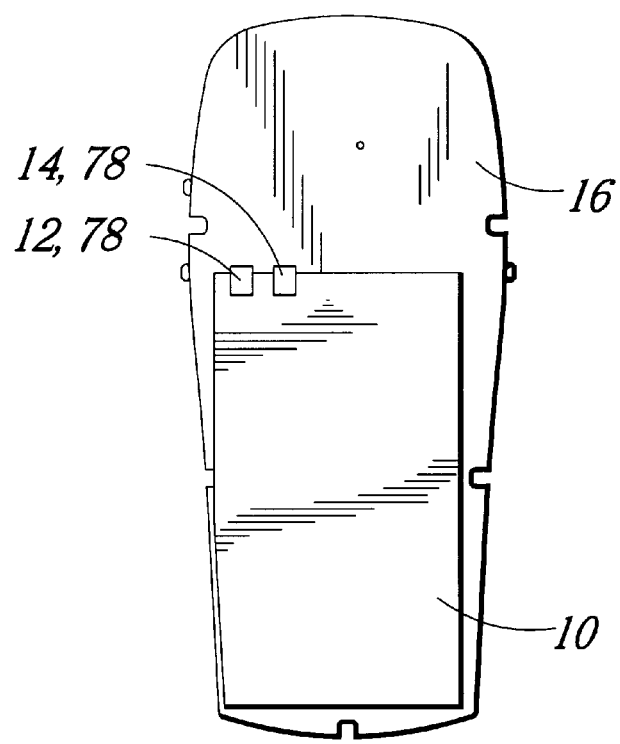
FIG. 12.

METHOD AND DEVICE FOR CONNECTING AN EL LAMP TO A PRINTED CIRCUIT BOARD

BACKGROUND OF THE INVENTION

1. Field of the Invention

The present invention relates generally to electrical connectors and contacts and, in particular, to a connector for releasably attaching an electroluminescent lamp to a printed circuit board.

2. Description of the Related Art

Electroluminescent (EL) lamps are widely used in applications in which a lamp is connected to a printed circuit board (PCB). In particular, EL lamps are utilized in a wide variety of electronic devices, such as cellular telephones, personal digital assistants (PDAs), and navigation units, for backlighting displays and keypads and for displaying information. An electroluminescent (EL) lamp typically has first and second outer, conductive layers. A dielectric layer is sandwiched between the two conductive layers. The dielectric layer conventionally includes an electroluminescent powder or, alternatively, an electroluminescent powder is positioned adjacent the dielectric layer. Application of an electric field across the two conductive outer layers causes the electroluminescent powder, which may be a phosphorous powder, to illuminate, thereby providing a lamp.

A wide variety of connectors are currently used for connecting an EL lamp to a printed circuit board. A continuing problem, however, is the inability to provide such a connection that is reliable, easy and cost effective to implement.

SUMMARY OF THE INVENTION

The present invention is a method and device for connecting an electroluminescent (EL) lamp to a printed circuit board. In a preferred embodiment, the present invention has a pair of clips which are soldered to a printed circuit board. Each clip serves as a connector for releasably connecting an EL lamp to the printed circuit board. In particular, each clip is somewhat U-shaped, having a bottom and a top which overlies the bottom. The clip is formed by bending sheet metal in a manner such that the top overlies the bottom. Thus, the clip has a first outer end that is closed, and a second outer end that is open. Preferably, the bent, closed end is of a sufficient dimension to provide some spacing between the top and the bottom of the clip. However, the top of the clip preferably angles downwardly from the closed end to a location at which the top engages the bottom of the clip. From that point, the top angles back upwardly to the second, open end of the clip, thereby creating a mouth portion of the clip into which the EL lamp may be easily inserted. Additionally, the bottom of each clip preferably has an upward protrusion at a location between the closed outer end and the point at which the top and bottom of the clip engage each other.

During assembly of an electronic device in which the printed circuit board/EL lamp combination is to be used, the clips are soldered onto the printed circuit board at a desired, preferably side-by-side, location. An EL lamp is then positioned into place within the clips by sliding a periphery of the EL lamp toward the clips and into the mouth of the clips. Insertion of the EL lamp causes the top of the clips to raise upwardly so that the EL lamp may pass that location at which the top of each clip contacts its bottom. When the EL lamp is completely inserted into the clips, each of a pair of contact pads on a bottom surface of the EL lamp contacts corresponding clips. In particular, each of a pair of contact pads on the EL lamp contacts the upward protrusion of its corresponding clip. The upward flexing of the top of each clip upon insertion of the EL lamp causes the tops of each clip to bias downwardly against the EL lamp, thereby sandwiching and securely holding the EL lamp in place within the clips. Should the EL lamp need to be removed (such as for repair of the lamp or the printed circuit board), the EL lamp may be easily withdrawn from the clips by applying a pulling force in a direction away from the clips.

In a preferred method of attaching an EL lamp to the printed circuit board according to the principles of the present invention, each clip is arranged in a side-by-side manner on the printed circuit board utilizing surface mount technology. In particular, a first solder screening step is performed during which solder is placed on the printed circuit board at locations corresponding to the desired locations of the clips. Subsequently, utilizing a surface mount device, each clip is positioned in its desired location (i.e., on the respective solder spots). Placement of each clip in its desired location is accomplished utilizing conventional surface mount technology, such as by vacuum-holding a clip until it is placed in its desired location and then releasing the suction of the vacuum and withdrawing the surface mounting device. The printed circuit board is subjected to a reflow solder process, during which the solder is heated to effect the solder between the clips and printed circuit board.

Following the reflow solder process, the EL lamp is placed within the clips. In one embodiment, the EL lamp is manually placed in the clips by moving a periphery of the EL lamp into the open mouth of the clips and applying a sufficient force to cause the top of each clip to flex upwardly, thereby permitting the EL lamp to be further inserted into the clip and, particularly, past the location at which the top of each clip contacts its bottom. When the EL lamp is fully inserted into the clips, the contact pads on the bottom of the EL lamp contact the bottom of corresponding clips. Particularly, each contact pad contacts a corresponding one of the upward protrusions on the bottom of its respective clip.

In an alternative method of attaching the EL lamp to the printed circuit board, the EL lamp is attached to the printed circuit board and, particularly, is positioned in the clips with a surface mount device. In this embodiment, the EL lamp is picked up by the surface mount device (e.g., by vacuum or suction), and moved into position within the clips by the surface mount device. Utilizing a surface mount device to attach the EL lamp to the printed circuit board results in a very efficient, cost effective assembly line process.

In an alternative embodiment of the present invention, the clips have a pair of downwardly extending leads. When mounting the clips to the printed circuit board, these leads are positioned through corresponding through holes and solder is allowed to wick into the holes about the leads, thereby soldering the clips to the printed circuit board.

BRIEF DESCRIPTION OF THE DRAWINGS

The objects and features of the invention noted above are explained in more detail with reference to the drawings, in which like reference numerals denote like elements, and in which:

FIG. 11 is a cross-sectional view illustrating the second embodiment of the connector clip of the present invention positioned on a printed circuit board; and FIG. 12 is a top plan view illustrating an EL lamp connected to a printed circuit board utilizing the connector clip(s) of the present invention.

DETAILED DESCRIPTION OF THE INVENTION

Figure 1:
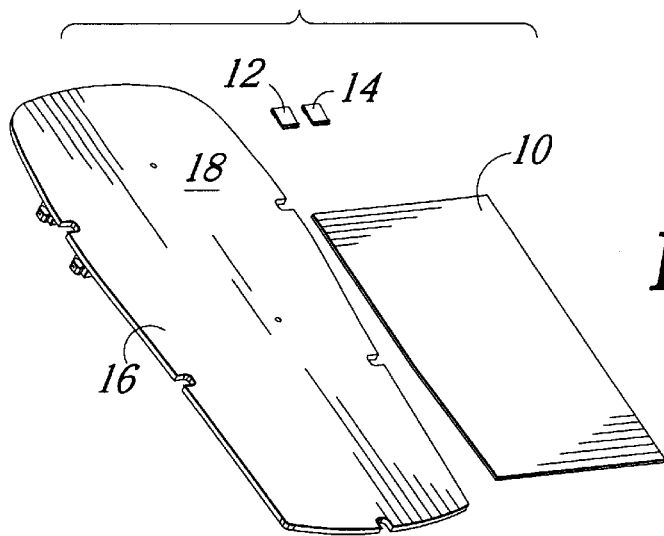
FIG. 1 is an exploded perspective view illustrating a printed circuit board, an electroluminescent (EL) lamp, and a connector, of the present invention, for connecting the EL lamp to the printed circuit board.

With reference initially to FIG. 1, a connector for connecting an electroluminescent (EL) lamp 10 to a printed circuit board 16 includes a pair of connector clips 12, 14. As will be described in detail below, the connector clips 12, 14 are mounted to a printed circuit board 16 and the EL lamp 10 is releasably positioned into the clips 12, 14. It will be understood and appreciated that the printed circuit board 16 will likely have through holes, and will have a wide variety of electronic equipment mounted to one or both of its upper surface 18 and lower surface (not shown).

The entire assembly consisting of the EL lamp 10, the connector clips 12, 14, and the printed circuit board 16 are subsequently positioned within a housing of an electronic device. In this regard, the system and method of the present invention for attaching an electroluminescent lamp to a printed circuit board results in an assembly that may be utilized in any type of electronic device requiring a visual display. For example, the assembly may be utilized in a wide variety of portable handheld electronic devices, depending upon the nature of the circuitry on the printed circuit board. As specific examples, the assembly may be utilized in portable or fixed mount navigation units, such as GPS devices, cellular telephones, or personal digital assistants (PDAs). The invention may also be utilized in other electronic equipment requiring panel mounted displays or back lighting, such as avionics equipment.

Figure 2:
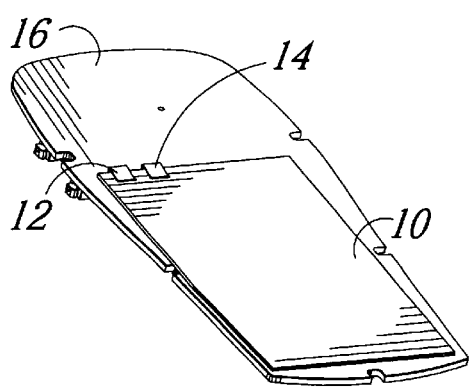
FIG. 2 is a perspective view illustrating the EL lamp connected to the printed circuit board by the connector.

As illustrated in FIG. 2, the connector clips 12, 14 are mounted on printed circuit board 16, and the EL lamp 10 is positioned within the clips by sliding the EL lamp 10 into the clips in the direction indicated.

Figure 3:
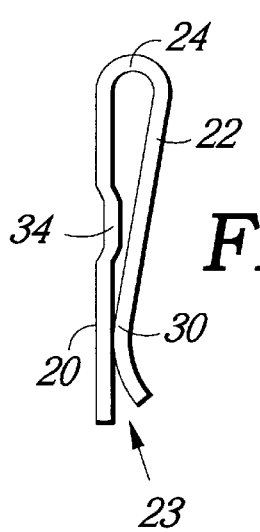
FIG. 3 is an elevational view of a connector clip of the present invention, for connecting an EL lamp to a printed circuit board, with the connector clip illustrated in an upright orientation.
Figure 4:
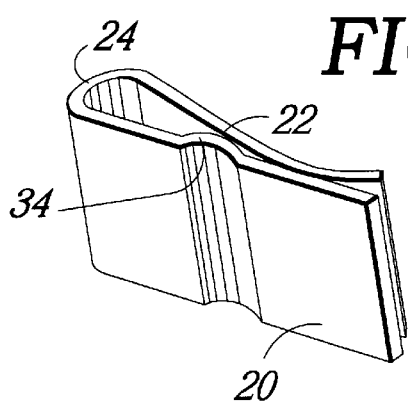
FIG. 4 is a perspective view of a first embodiment of the connector clip of the present invention.
Figure 5:
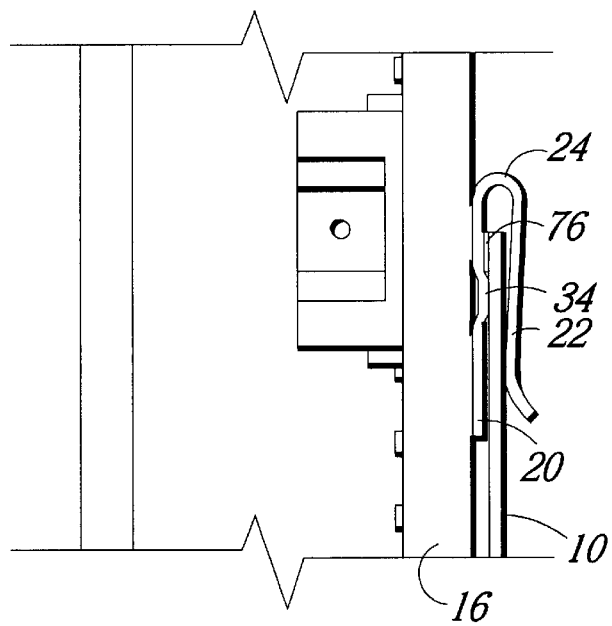
FIG. 5 is a side view of a printed circuit board having an EL lamp attached to it by one or more connector clips of the present invention.

With reference to FIGS. 3 and 4, each connector clip 12, 14 is preferably integrally formed of sheet metal. Particularly, each connector clip 12, 14 is preferably formed of an electrically conductive material or, at a minimum, is coated with electrically conductive material. In a preferred embodiment, each connector clip 12, 14 is formed of beryllium copper. As illustrated, each connector clip 12, 14 has a bottom 20 and a top 22. The first outer end 24 of each connector clip 12, 14 is closed due to formation of the clips 12, 14 by bending the sheet metal into the structure illustrated. A second outer end of each connector clip 12, 14, defined by the respective outer ends of the bottom 20 and top 22 of each clip 12, 14, forms an open mouth 23 in the clip. As illustrated, each clip 12, 14 is preferably constructed so that the bent closed end 24 of the clip creates space between the top 22 and bottom 20, and so that the top 22 angles downwardly from the closed end 24 to a point 30 at which the top 22 engages the bottom 20. From that point, the top 22 angles or flares upwardly away from the bottom, thus creating a mouth at the open outer end of each clip 12, 14. Additionally, bottom 20 of each clip 12, 14 has an upwardly protruding portion 34. Upwardly protruding portion 34 is preferably positioned between the point 30 at which the bottom 20 and top 22 touch and the closed outer end 24 of the clip. As illustrated in FIG. 5, when EL lamp 10 is positioned within a connector clip 12 or 14, the upwardly protruding portion 34 on the bottom of the clip contacts a corresponding contact pad on a bottom side of the EL lamp. In particular, the bottom side of EL lamp 10 has a pair of electrical contact pads such as contact pad 76 illustrated such that each of the contact pads contacts a corresponding one of the connector clips 12, 14.

Figure 6:
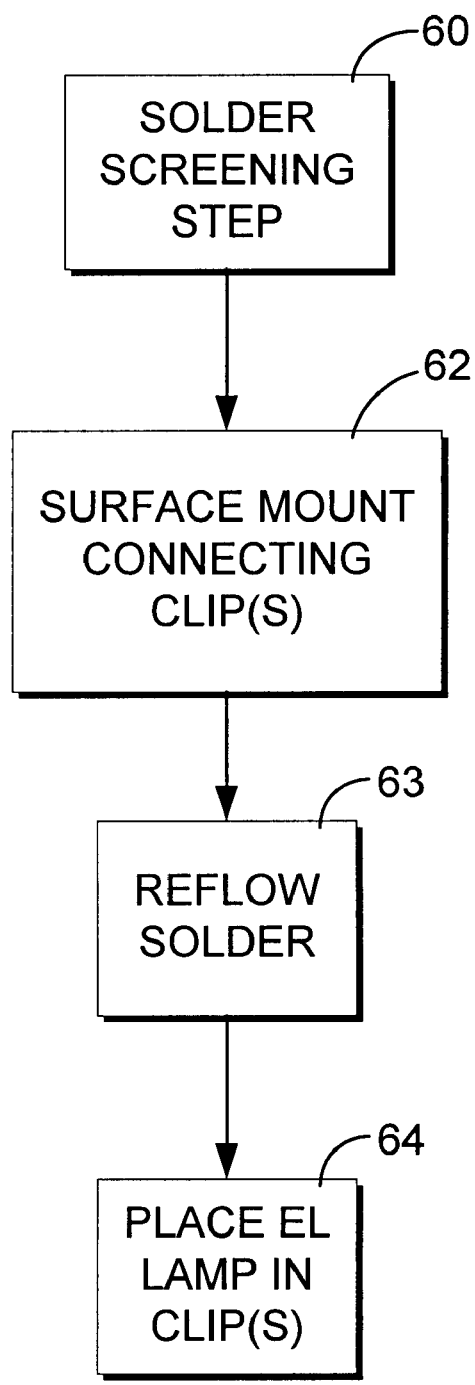
FIG. 6 is a flow diagram illustrating a method for attaching an EL lamp to a printed circuit board according to the present invention.

With reference now to FIGS. 6 and 7, a method of attaching EL lamp 10 to printed circuit board 16 is illustrated and described. In particular, as evidenced by referenced numeral 60 in FIG. 6, a solder screening step is performed. As illustrated in FIG. 7a, solder 70 is placed on printed circuit board 16 through a conventional solder screening process. In particular, solder compound is screened to a pair of side-by-side locations corresponding to desired locations for clips 12 and 14.

Figure 7A:
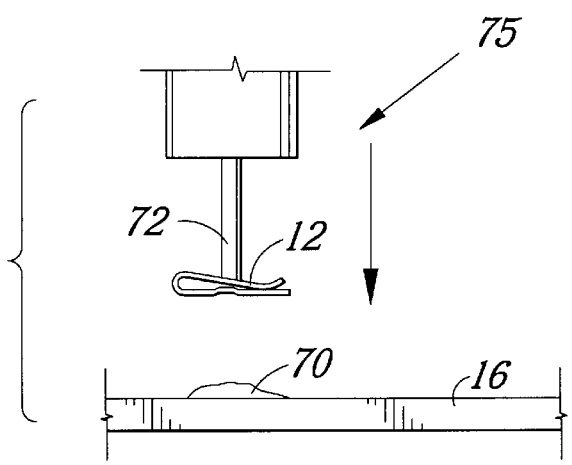
FIGS. 7a–7d illustrate a surface mounting device utilized in one embodiment of the inventive method for attaching an EL lamp to the printed circuit board.

As indicated at step 62 in FIG. 6, connecting clips 12, 14 are then surface mounted to the printed circuit board 16. As illustrated in FIG. 7a, this is accomplished using surface mount technology, in which a vacuum mounting technique is employed. In particular, for example, connector clip 12 is picked up by a surface mounting device 75. The surface mounting device has a placement mechanism or apparatus which includes a vacuum tube 72, connected to a vacuum source (not shown), for holding the connector clip 12 by suction. As will be appreciated by those with skill in the art of printed circuit board surface mounting technology, connector clip 12 is preferably retrieved from a tape and reel holder for placement on the printed circuit board 16. In particular, the surface mounting device locates the connector clip 12 above the solder 70, and is moved downwardly in the direction of the arrow in FIG. 7a to locate the connector clip 12 at the location of the solder 70. A similar operation is performed in conjunction with connector clip 14. As indicated at step 63 of FIG. 6, the next step in the method is to reflow the solder. This is accomplished in a conventional manner by reheating the solder 70 to form a strong bond between the printed circuit board 16 and the connector clip 12. Understandably, the solder reflow step is preferably performed after all necessary electrical components have been placed on the board 16.

As indicated at step 64, the last step in the method of attaching the EL lamp 10 to the printed circuit board 16 is to place the EL lamp in the clips 12, 14 that have been soldered to the printed circuit board 16. Placement of the EL lamp 10 into the clips 12, 14 may be accomplished manually, such as by a worker holding the EL lamp 10 in his or her hands and sliding the EL lamp into place within the clips 12, 14.

Figure 7B:
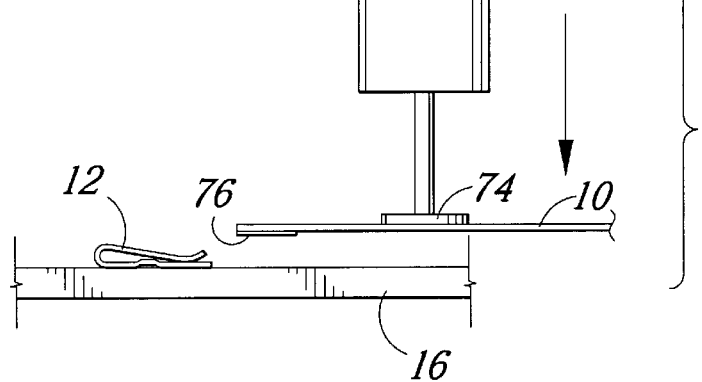
Figure 7C:
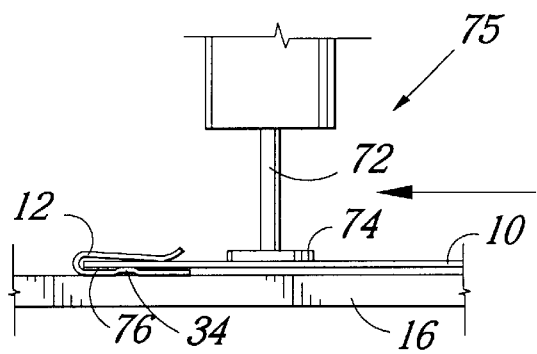
Figure 7D:
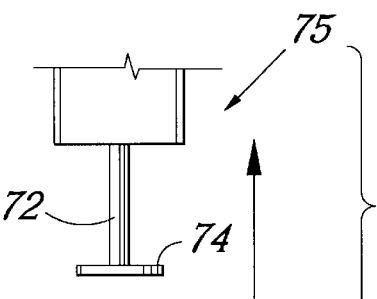
Figure 8:
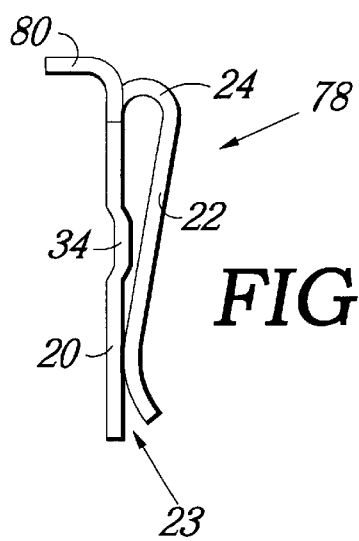
FIG. 8 is an side elevational view of a second embodiment of the connector clip of the present invention with the connector clip illustrated in an upright orientation.

Alternatively, an advantageous feature of the present invention is the ability to automatically place the EL lamp 10 in the clips 12, 14, such as is illustrated in FIGS. 7b–7d. In particular, as illustrated in FIG. 7d, the surface mount device has a displacement head 74 at its outer end, thus increasing the suction area of the device. The surface mount device picks up, by vacuum, the EL lamp 10 and moves downwardly in the direction of the arrow in FIG. 7b. As illustrated in FIG. 7c, the surface mount device then moves in the direction of the arrow in FIG. 7c and, in particular, moves in a direction that is horizontal to the plane of the printed circuit board 16 and, specifically, is along the surface of the printed circuit board 16. In so doing, an outer periphery of the EL lamp slides within the open end (e.g., mouth) of each of connector clips 12, 14. As shown in FIG. 7c, when the EL lamp 10 is positioned within the connector clips, the top of the connector clip flexes upwardly to accommodate the EL lamp 10. As illustrated, the EL lamp 10 is compressed between the top 22 and the bottom 20 of the clips 12, 14 at the point 30 (at which top 22 and bottom 20 contact each other in the absence of EL lamp 30). Additionally, once the EL lamp 10 is placed within the clips 12, 14, the contact pads, such as contact pad 76 on the bottom surface of EL lamp 10 (with the other contact pad being located behind pad 76 and not shown) contacts the upwardly protruding portions 34 on the bottom 20 of corresponding clips 12, 14. As illustrated in FIG. 7d, the vacuum of the surface mount device is then released, and the surface mount device is withdrawn upwardly, in the direction of the arrow illustrated in FIG. 7d, thereby completing attachment of the EL lamp 10 to the clips 12, 14.

With reference now to FIGS. 8–11, an alternate embodiment of the connector clips 12, 14 is illustrated and described.

Figure 9:
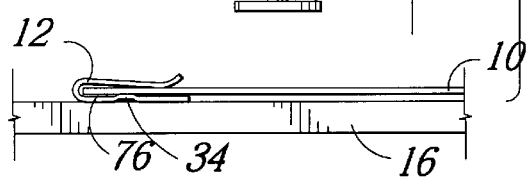
FIG. 9 is an end elevational view of the second embodiment of the connector clip of the present invention.
Figure 10:
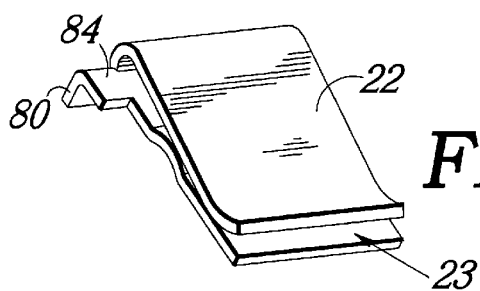
FIG. 10 is a perspective view of the second embodiment of the connector clip of the present invention.

In particular, in the embodiment of the present invention illustrated in FIGS. 8–11, a connector clip 78 for attaching an EL lamp to a printed circuit board is constructed much like connector clip 12 or 14 described in the foregoing embodiment. The clip 78, like clips 12, 14, has a bottom 20, a top 22, a closed, bent end 24, an open mouth 23, and a protrusion 34. However, unlike clips 12, 14, the connector clip 78 has first and second downwardly extending leads 80, 82. In particular, corresponding flanges 84, 86 extend outwardly from the connector clip 78 as illustrated, and are bent downwardly to form the respective leads 80, 82. As illustrated in FIG. 9, connector clip 78 of this embodiment is positioned on a printed circuit board 16 by placement of the posts 80, 82 in corresponding through holes 88 in the printed circuit board 16. Upon application of solder to the holes 88, the solder wicks into the holes and about the leads, thereby securing the clip 78 to the printed circuit board 16.

As illustrated in FIGS. 2 and 12, the connector clips, constructed according to either embodiment of the present invention (e.g., without posts or with posts), are positioned as illustrated on an elongated printed circuit board. EL lamp 10 is shown as positioned in place within the connector clips, such that the resilient bias of the connector clips serves to hold the EL lamp 10 within the clips and in position on the printed circuit board 16. Additionally, first and second contact pads on the bottom surface of the EL lamp 10 contact the upward protrusion on the bottom of corresponding clips, thereby providing electrical contact between the clips and EL lamp. As will be appreciated, an electrical charge will be applied across the two clips, which is in turn transferred to the corresponding contact pads on the EL lamp, thus creating a potential in the EL lamp and across the phosphorous layer, causing the phosphorous to glow.

In use, the assembled printed circuit board and EL lamp may, as discussed, be utilized in an electronic device. In particular, for example, the assembly may be utilized in a portable handheld device, such as a navigation device, personal digital assistant, or cellular telephone, or may be used in fixed or panel mounted electronic devices.

From the foregoing it will be seen that this invention is one well adapted to attain all ends and objects hereinabove set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative, and not in a limiting sense.

What is claimed is:

1. A method of attaching an electroluminescent lamp, having at least one contact, to a printed circuit board, said method comprising:

providing a clip, said clip having a bottom and a top;

attaching said clip to said printed circuit board with a soldering step; and sliding said electroluminescent lamp into said clip, said sliding step comprising:

providing an apparatus for releasably holding said electroluminescent lamp;

moving said holding apparatus, while holding said electroluminescent lamp so that said electroluminescent lamp slides into said clip; and releasing said holding apparatus from said electroluminescent lamp.

2. The method as set forth in claim 1, wherein said clip has an open end defined by the outer ends of said first and second leg members, and a closed end, wherein said step of sliding comprises sliding electroluminescent lamp into said open end of said clip.

3. The method as set forth in claim 2, wherein said open end of said clip opens in a direction that is substantially parallel to a plane of said printed circuit board, wherein said sliding step comprises sliding said electroluminescent lamp in a direction that is parallel to said plane of said printed circuit board.

4. The method as set forth in claim 1, wherein said soldering step utilizes surface mount technology.

5. The method as set forth in claim 1, wherein said step of providing an apparatus for releasably holding said electroluminescent lamp comprises providing an apparatus that holds said electroluminescent lamp by a vacuum.

6. A product manufactured according to the method of claim 1.

7. A method of attaching an electroluminescent lamp to a printed circuit board, said method comprising:

soldering a clip to said printed circuit board by applying solder compound to said circuit board and vacuum-holding said clip and moving said clip into a position on said solder compound; and connecting said electroluminescent lamp to said clip by vacuum holding said lamp and moving said lamp into said clip.

8. A product manufactured according to the method of claim 7.

* * * * *